(12) United States Patent
Hirabayashi

(10) Patent No.: US 8,018,756 B2
(45) Date of Patent: Sep. 13, 2011

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 12/474,498

(22) Filed: May 29, 2009

(65) Prior Publication Data

US 2009/0303777 A1    Dec. 10, 2009

(30) Foreign Application Priority Data

Jun. 5, 2008    (JP) .................................. 2008-147572

(51) Int. Cl.
*G11C 11/00* (2006.01)
*G11C 5/06* (2006.01)
*G11C 7/00* (2006.01)

(52) U.S. Cl. ............. 365/154; 365/63; 365/72; 365/203

(58) Field of Classification Search .................. 365/154, 365/155, 156, 63, 72, 203
See application file for complete search history.

(56) References Cited

U.S. PATENT DOCUMENTS

| | | | | |
|---|---|---|---|---|
| 6,097,651 A | * | 8/2000 | Chan et al. ..................... | 365/203 |
| 6,181,608 B1 | * | 1/2001 | Keshavarzi et al. ............ | 365/188 |
| 6,901,016 B2 | * | 5/2005 | Miyashita et al. ............ | 365/203 |
| 6,990,034 B2 | * | 1/2006 | Ashizawa ...................... | 365/227 |
| 7,684,264 B2 | * | 3/2010 | Hunter et al. ............... | 365/189.2 |
| 2004/0156230 A1 | * | 8/2004 | Satomi et al. .................. | 365/154 |
| 2004/0208036 A1 | * | 10/2004 | Chen et al. ...................... | 365/63 |
| 2008/0192527 A1 | * | 8/2008 | Yabe ................................. | 365/63 |
| 2009/0168484 A1 | * | 7/2009 | Liaw ............................... | 365/72 |
| 2010/0182823 A1 | * | 7/2010 | Garg et al. ..................... | 365/156 |
| 2010/0214815 A1 | * | 8/2010 | Tam et al. ........................ | 365/72 |

OTHER PUBLICATIONS

U.S. Appl. No. 12/430,283, filed Apr. 27, 2009, Osamu Hirabayashi.
Leland Chang et al., "Stable SRAM Cell Design for the 32 nm Node and Beyond", 2005 Symposium on VLSI Technology Digest of Technical Papers, 2 pages.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

A semiconductor memory device according to an aspect of the invention includes plural writing word lines; first and second writing bit lines that intersect with the writing word lines; and plural memory cells that are provided at portions in which the plural writing word lines and the first and second writing bit lines intersect with each other. In the semiconductor memory device, the memory cell includes a flip-flop circuit that includes first and second nodes of a complementary pair; a first transfer transistor that is connected between the first writing bit line and the first node, a gate of the first transfer transistor being connected to the writing word line; and a second transfer transistor that is connected between the second writing bit line and the second node, a gate of the second transfer transistor being connected to the writing word line. The first and second writing bit lines are in a floating state whenever data is not written in the memory cell.

2 Claims, 4 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2008-147572, filed on Jun. 5, 2008, the entire contents of which are incorporated herein by reference.

BACKGROUND OF THE INVENTION

1. Field of the Invention

The present invention relates to a semiconductor memory device, and particularly to SRAM including an eight-transistor memory cell.

2. Description of the Related Art

In LSI used in portable devices, low power consumption is required to extend battery life. Although lowering of a power supply voltage is effective for the low power consumption, recently a variation in characteristic among elements is increased with the progress of scaling factor, and an operation margin of SRAM used in LSI is reduced to hardly lower an operation voltage of SRAM. Therefore, the power supply voltage of the whole of LSI cannot be lowered by the operation voltage of SRAM.

In a conventional six-transistor memory cell, because a cell node constituting a flip-flop circuit is slightly pulled up in selecting a word line, data in the flip-flop circuit becomes unstable. Therefore, data is broken when the power supply voltage is lowered.

For example, use of an eight-transistor memory cell in which a read port is separated is proposed as countermeasures against the disturb problem (see L Chang, et al., Symposium on VLSI Technology 2004, p128). In the eight-transistor memory cell, even if the word line is selected during data read, the disturb problem can be prevented because the cell node of the flip-flop circuit is not pulled up. However, the eight-transistor memory cell performs the operation similar to that of the conventional six-transistor memory cell during data write.

In order to prevent the disturb problem during the data write, it is necessary that a data write operation be performed to all the memory cells selected by writing word lines. SRAM of LSI has a function of writing only part of data in input data bits, and generally has a byte write function of being able to control whether the data write is performed in units of byte. When the byte write function is supported in the eight-transistor memory cell, the word line is divided in each one byte that is a minimum write unit, and control is performed so as to select only the word line of the byte in which the data write is performed, which prevents the disturb problem during the data write.

Therefore, the low voltage can be realized because the disturb problem is avoided during both the data read and the data write. However, the eight-transistor memory cell performs the data write operation similar to that of the six-transistor memory cell, which results in a problem in that a lower limit value of the operation voltage is determined by the data write characteristic.

SUMMARY OF THE INVENTION

In accordance with a first aspect of the invention, a semiconductor memory device includes plural word lines each of which includes a writing word line and a reading word line; plural bit lines each of which includes first and second writing bit lines and a reading bit line, the first and second writing bit lines and the reading bit line intersecting with the plural word lines; and plural memory cells that are provided at portions in which the plural word lines and the plural bit lines intersect with each other. The memory cell includes a flip-flop circuit in which inputs and outputs of a first inverter and a second inverter are mutually connected, the first inverter including a first transistor of the first conduction type and a second transistor of the second conduction type, the first inverter being connected between a power supply line and a ground line, the second inverter including a third transistor of the first conduction type and a fourth transistor of the second conduction type, the second inverter being connected between the power supply line and the ground line; a fifth transistor of the second conduction type that is connected between the output of the first inverter and the first writing bit line, a gate of the fifth transistor being connected to the writing word line; a sixth transistor of the second conduction type that is connected between the output of the second inverter and the second writing bit line, a gate of the sixth transistor being connected to the writing word line; a seventh transistor of the second conduction type, in which a drain is connected to the reading bit line and a gate is connected to the reading word line; and an eighth transistor, in which a source is connected to the ground line, a drain is connected to the source of the seventh transistor, and a gate is connected to the input of the first inverter and the output of the second inverter. The first and second writing bit lines are in a floating state whenever data is not written in the memory cell.

In accordance with a second aspect of the invention, a semiconductor memory device includes plural word lines each of which includes a writing word line and a reading word line; plural bit lines each of which includes first and second writing bit lines and first and second reading bit lines, the first and second writing bit lines and the first and second reading bit lines intersecting with the plural word lines; and plural memory cells that are provided at portions in which the plural word lines and the plural bit lines intersect with each other. The memory cell includes a flip-flop circuit in which inputs and outputs of a first inverter and a second inverter are mutually connected, the first inverter including a first transistor of the first conduction type and a second transistor of the second conduction type, the first inverter being connected between a power supply line and a ground line, the second inverter including a third transistor of the first conduction type and a fourth transistor of the second conduction type, the second inverter being connected between the power supply line and the ground line; a fifth transistor of the second conduction type that is connected between the output of the first inverter and the first writing bit line, a gate of the fifth transistor being connected to the writing word line; a sixth transistor of the second conduction type that is connected between the output of the second inverter and the second writing bit line, a gate of the sixth transistor being connected to the writing word line; a seventh transistor of the second conduction type that is connected between the output of the first inverter and the first reading bit line, a gate of the seventh transistor being connected to the reading word line; and an eighth transistor of the second conduction type that is connected between the output of the second inverter and the second reading bit line, a gate of the eighth transistor being connected to the reading word line. The first and second writing bit lines are in a floating state whenever data is not written in the memory cell.

In accordance with a third aspect of the invention, a semiconductor memory device includes plural writing word lines; first and second writing bit lines that intersect with the writing word lines; and plural memory cells that are provided at portions in which the plural writing word lines and the first and second writing bit lines intersect with each other. The memory cell includes a flip-flop circuit that includes first and second nodes of a complementary pair; a first transfer transistor that is connected between the first writing bit line and the first node, a gate of the first transfer transistor being connected to the writing word line; and a second transfer transistor that is connected between the second writing bit line and the second node, a gate of the second transfer transistor being connected to the writing word line. The first and second writing bit lines are in a floating state whenever data is not written in the memory cell.

DETAILED DESCRIPTION OF THE EMBODIMENTS

A semiconductor memory device according to an embodiment of the invention will be described below in detail with reference to the drawings.

First Embodiment

Figure 1:
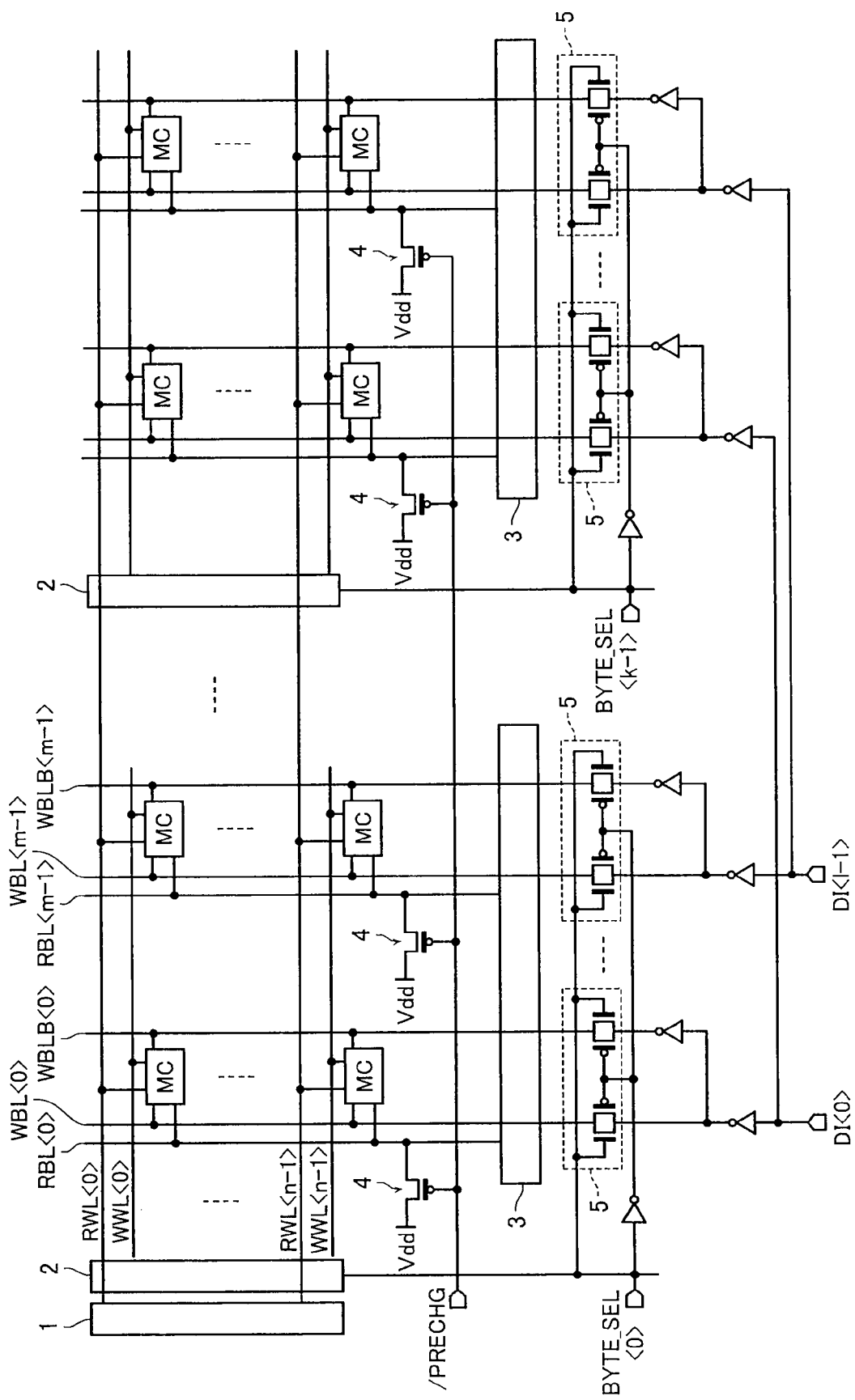
FIG. 1 illustrates a configuration of SRAM according to a first embodiment of the invention.

FIG. 1 illustrates a configuration of SRAM according to a first embodiment of the invention.

The SRAM of the first embodiment includes plural writing word lines WWL, plural reading word lines RWL, plural first and second writing bit lines WBL and WBLB, and plural reading bit lines RBL. The first and second writing bit lines WBL and WBLB and the reading bit line RBL intersect with the word lines WWL and RWL. A memory cell MC is connected to each portion in which the word lines WWL and RWL intersect with the bit lines WBL, WBLB, and RBL. The writing word line WWL is divided into some unit writing word lines WWL<0>, . . . , and a predetermined number of memory cells MC that simultaneously perform the data write are connected to each of the unit writing word lines WWL<0>, . . . . For example, in the case of the data write function in units of one byte, the eight memory cells MC are collectively connected to each of the unit writing word lines WWL<0>, . . . .

A global word line driver 1 is connected to one end of the reading word line in order to select the reading word line RWL. A local word line driver 2 is connected to one end of each of the unit writing word lines WWL<0>, . . . . The local word line driver 2 is activated in response to a byte selection signal BYTE_SEL supplied from a controller (not illustrated), and is used to select each of the unit writing word lines WWL<0>, . . . according to a memory address.

A read circuit 3 is connected to one end of the reading bit line RBL in order to detect, amplify, and read the data in the memory cell MC. One read circuit 3 is shared by a predetermined number of memory cells MC connected to one unit writing word line WWL<i> for the purpose of data read. A precharge circuit 4 is connected to each reading bit line RBL, and the precharge circuit 4 precharges each reading bit line RBL to a power supply voltage Vdd before the data read. The precharge circuit 4 is controlled by a negative-logic precharge signal/PRECHG supplied from the controller (not illustrated).

A transfer gate circuit 5 is connected to one end of the writing bit lines WBL and WBLB, and is controlled by the byte selection signal BYTE_SEL. When the transfer gate circuit 5 is turned on, input data DI given from the outside is supplied to the memory cell MC through a data input and output buffer (not illustrated) and the writing bit lines WBL and WBLB. The precharge circuit 4 is not connected to the writing bit lines WBL and WBLB. Accordingly, the writing bit lines WBL and WBLB except for the writing bit lines WBL and WBLB selected during the data write become floating states.

The memory cell MC of the first embodiment will be described below.

Figure 2:
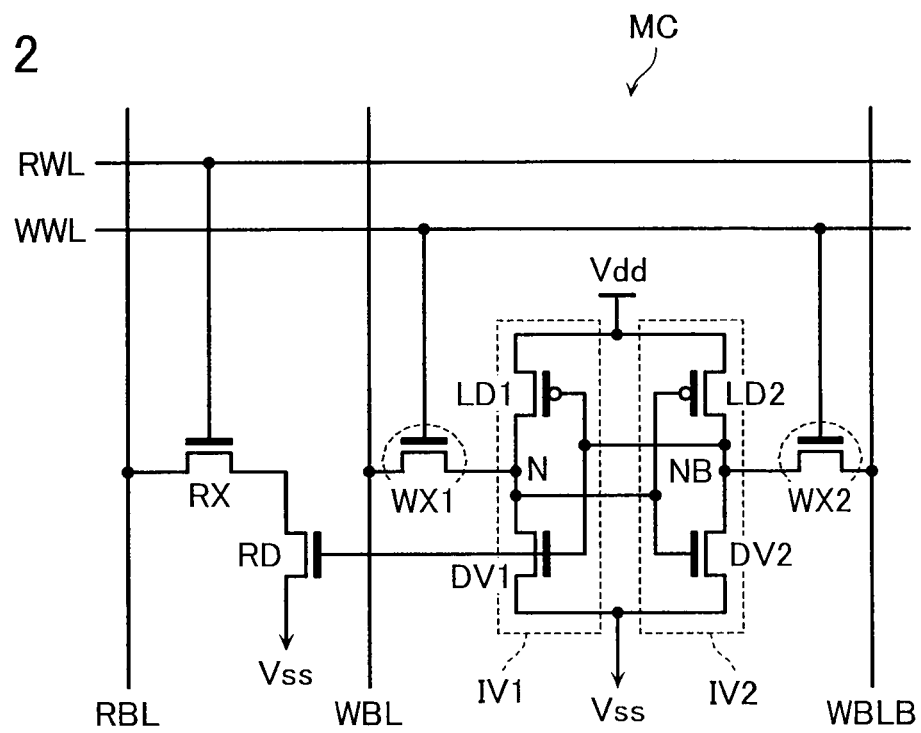
FIG. 2 is a circuit diagram illustrating a memory cell of the first embodiment.

FIG. 2 is a circuit diagram of the memory cell MC of FIG. 1.

The memory cell MC of the first embodiment is an eight-transistor memory cell in which a reading port and a writing port are independently provided. Referring to FIG. 2, the memory cell MC includes a first inverter IV1 and a second inverter IV2. The first inverter IV1 includes a loading transistor LD1 that is the first transistor of the first conduction type and a driving transistor DV1 that is the second transistor of the second conduction type. The loading transistor LD1 and the driving transistor DV1 are connected to each other in a complementary pair manner. A source of the loading transistor LD1 is connected to a power supply line having a level of a power supply voltage Vdd that is the first potential, and a source of the driving transistor DV1 is connected to a ground line having a level of a ground voltage Vss that is the second potential. The second inverter IV2 includes a loading transistor LD2 that is the third transistor of the first conduction type and a driving transistor DV2 that is the fourth transistor of the second conduction type. The loading transistor LD2 and the driving transistor DV2 are connected to each other in a complementary pair manner. A source of the loading transistor LD2 is connected to the power supply line having the level of the power supply voltage Vdd, and a source of the driving transistor DV2 is connected to the ground line having the level of the ground voltage Vss. Outputs and inputs of the inverters IV1 and IV2 are mutually connected. A first transfer transistor WX1 that is the fifth transistor of the second conduction type is connected between the first writing bit line WBL and an output of the first inverter IV1, and a second transfer transistor WX2 that is the sixth transistor of the second conduction type is connected between the second writing bit line WBLB and an output of the second inverter IV2. Gates of the transfer transistors WX1 and WX2 are connected to the writing word line WWL. A transfer transistor RX that is the seventh transistor of the second conduction type and a driving transistor RD that is the eighth transistor of the second conduction type are connected in series between the reading bit line RBL and the ground line. A gate of the transfer transistor RX is connected to the reading word line RWL, and a gate of the driving transistor RD is connected to an input of the first inverter IV1.

Threshold voltages Vth of the transfer transistors WX1 and WX2 in the memory cell MC are lower than threshold voltages Vth of the driving transistors DV1 and DV2.

In the memory cell MC of FIG. 2, a P-channel MOS transistor is used as the first conduction type transistor, and an N-channel MOS transistor is used as the second conduction type transistor.

The operation of SRAM having the above-described configuration will be described below.

First, the data read operation will be described.

Before the data read, the precharge circuit 4 previously precharges the reading bit line RBL to "H".

At this point, when the reading word line RWL becomes "H", the transfer transistor RX is turned on. In cases where "H" is retained in the first cell node N, because the second cell node NB becomes "L", the driving transistor RD connected to the second cell node NB is maintained in the off-state. Accordingly, because the reading word line RBL is not connected to the ground line having the level of the ground voltage Vss, the reading word line RBL is maintained at the voltage level of "H" equal to that of the cell node N. On the other hand, in cases where "L" is retained in the first cell node N, because the second cell node NB becomes "H", the driving transistor RD connected to the second cell node NB is turned on. Accordingly, the reading bit line RWL is connected to the ground line having the level of the ground voltage Vss. As a result, the reading bit line RBL is driven to "L" of the cell node N.

A sense amplifier included in the read circuit 3 detects and amplifies a voltage at the reading bit line RBL, and the voltage is read to the outside.

Then the data write operation will be described.

Figure 3:
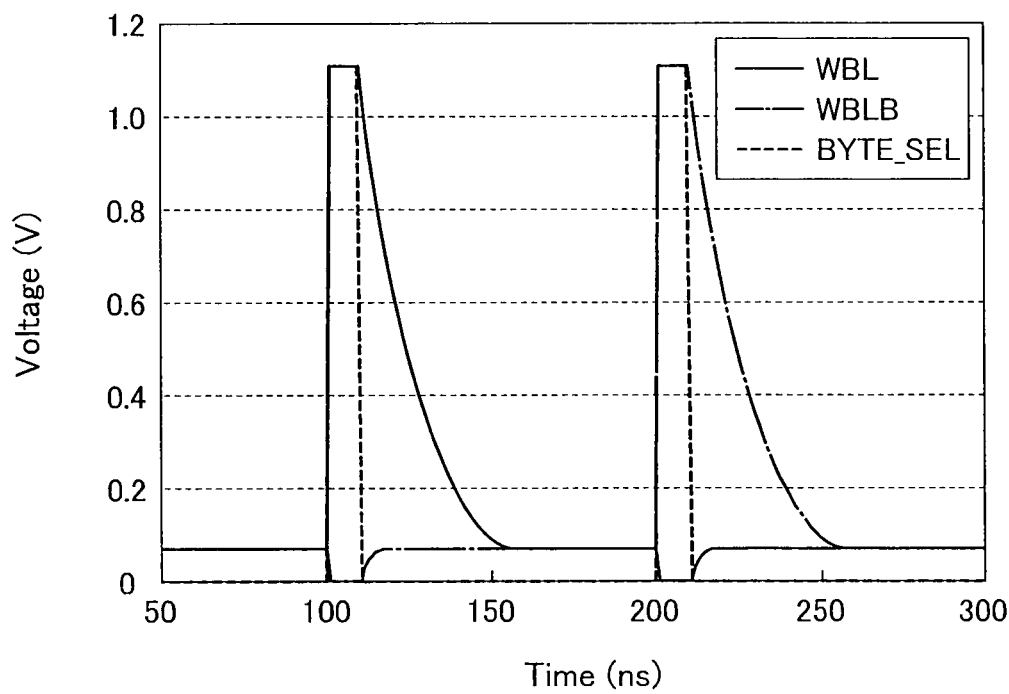
FIG. 3 illustrates an operating waveform during data write in the first embodiment.

FIG. 3 is a graph illustrating operation waveforms of the writing bit lines WBL and WBLB and byte selection signal BYTE_SEL during the data write.

As described above, the writing bit lines WBL and WBLB are in the floating state before the data write operation (100 ns or more before). At this point, the voltages at the writing bit lines WBL and WBLB are stabilized at proper values (in the example of FIG. 3, about 80 mV) according to leak currents of the transfer transistors WX1 and WX2 in the memory cell MC.

When the byte selection signal BYTE_SEL becomes "H" (100 ns), the input data DI given from the outside is supplied to the writing bit lines WBL and WBLB to release the floating state. At this point, the voltages at the writing bit lines WBL and WBLB become 0 V ("L") and 1.1 V ("H") in the example of FIG. 3.

When the writing word line WWL becomes "H", the two transfer transistors WX1 and WX2 are turned on, thereby connecting the writing bit lines WBL and WBLB and the cell nodes N and NB, respectively. As a result, the pieces of data "L" and "H" of the writing bit lines WBL and WBLB are supplied to the cell nodes N and NB, and the pieces of data "L" and "H" are retained in the flip-flop circuit including the inverters IV1 and IV2 (100 ns to 110 ns). After the data write (110 ns), the writing bit lines WBL and WBLB return to the floating state, and the voltages of the writing bit lines WBL and WBLB gently converge slowly to around 80 mV (110 ns to 150 ns).

Figure 4:
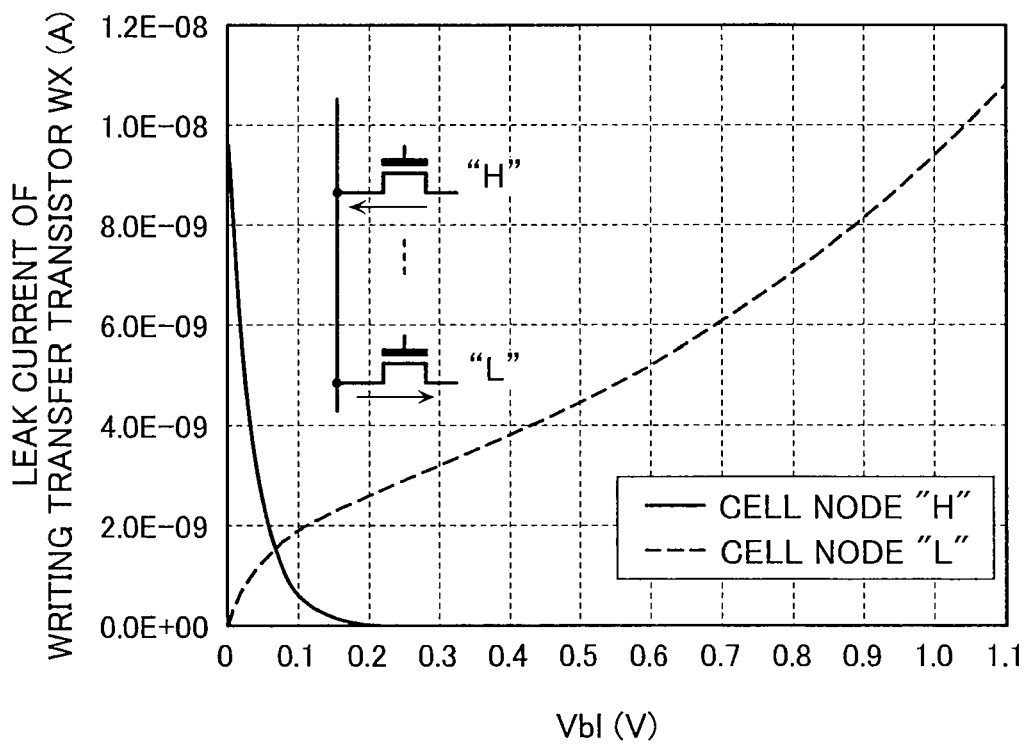
FIG. 4 is a graph illustrating a relationship between a voltage at a writing bit line and a leak current of a writing transfer transistor in the first embodiment.

FIG. 4 is a graph illustrating a relationship between voltages Vb1 at the writing bit lines WBL and WBLB and leak currents of the transfer transistors WX1 and WX2. Flowing directions of the leak currents of the transfer transistors WX1 and WX2 depend on the voltages at the cell nodes N and NB. The graphs illustrated by a solid line and a broken line of FIG. 4 indicate the cases in which the cell nodes N and NB are "H" and "L", respectively. Although the transfer transistor WX1 will be described below, the same holds true for the transfer transistor WX2.

In cases where the cell node N is "L", the leak current is maximized when the voltage Vb1 at the writing bit line WBL is at the level of the power supply voltage Vdd. Because a drain-source voltage of the transfer transistor WX1 is decreased as the voltage Vb1 at the writing bit line WBL is decreased, the threshold voltage Vth is increased while the leak current is decreased by a DIBL (Drain Induced Barrier Lowering) effect.

On the other hand, in cases where the cell node N is "H", the leak current is maximized when the writing bit line WBL has the voltage Vb1 of 0 V, and the leak current is rapidly decreased when the voltage Vb1 at the writing bit line WBL is increased to make the source-gate voltage of the transfer transistor WX1 negative. Because the source-gate voltage becomes negative, the threshold voltage Vth of the transfer transistor WX1 is increased while the leak current is decreased by a back bias effect.

In cases where the writing bit line WBL is in the floating state, the voltage Vb1 at the writing bit line WBL is stabilized at a potential in which a balance is established between the leak current from the memory cell MC whose cell node N is "H" and the leak current to the memory cell MC whose cell node N is "L" in the memory cells MC connected to the same writing bit line WBL. The leak current of the writing transfer transistor WX1 is maximized, when the number of memory cells MC whose cell nodes N are "H" is equal to the number of memory cells MC whose cell nodes N are "L" in the plural memory cells MC that share one writing bit line WBL. In such cases, the voltage Vb1 is stabilized around 80 mV at which the solid line and broken line of FIG. 4 intersect with each other. Accordingly, the leak current can be reduced to about 14% by setting the writing bit line WBL in the floating state compared with the case (Vb1=1.0 V of FIG. 4) in which the writing bit line WBL is precharged to the power supply voltage Vdd.

In the data write operation, unless a driving force of the transfer transistor WX1 is sufficiently larger than a driving force of the loading transistor LD1, the cell node NB of the memory cell MC cannot sufficiently be pulled down on the side of the writing bit line WBLB of "L", and a data write failure is generated. Because the data write failure becomes prominent as the power supply voltage Vdd is decreased, there is a limitation to the lowering of the power supply voltage Vdd.

Figure 5:
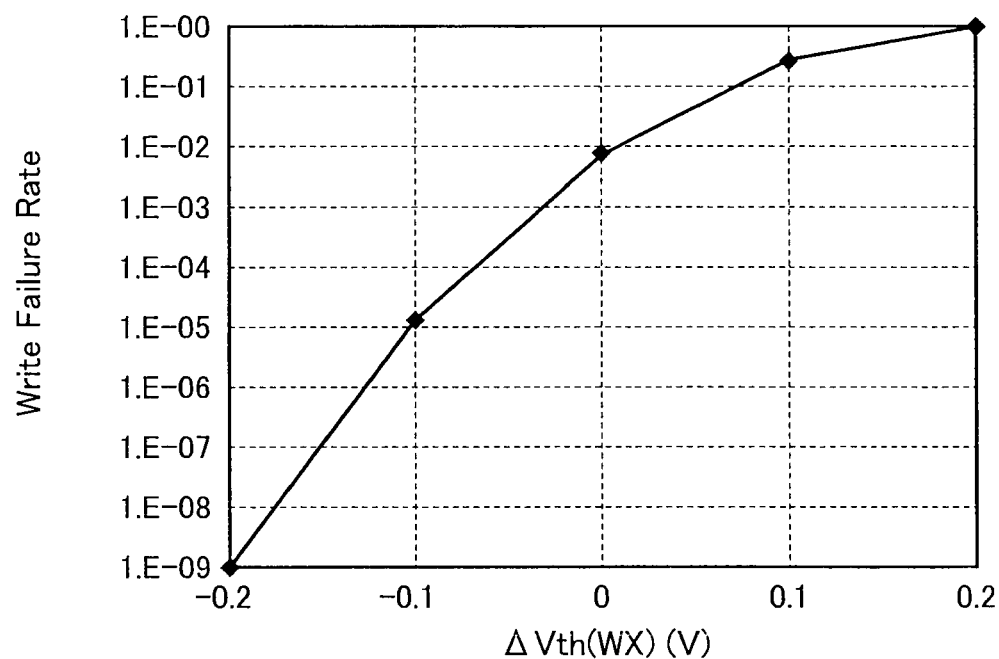
FIG. 5 is a graph illustrating a relationship between a threshold at a writing transfer transistor and a data write failure rate in the first embodiment.

FIG. 5 is a graph illustrating a relationship between the threshold voltage Vth of the transfer transistor WX and a write failure rate.

Figure 6:
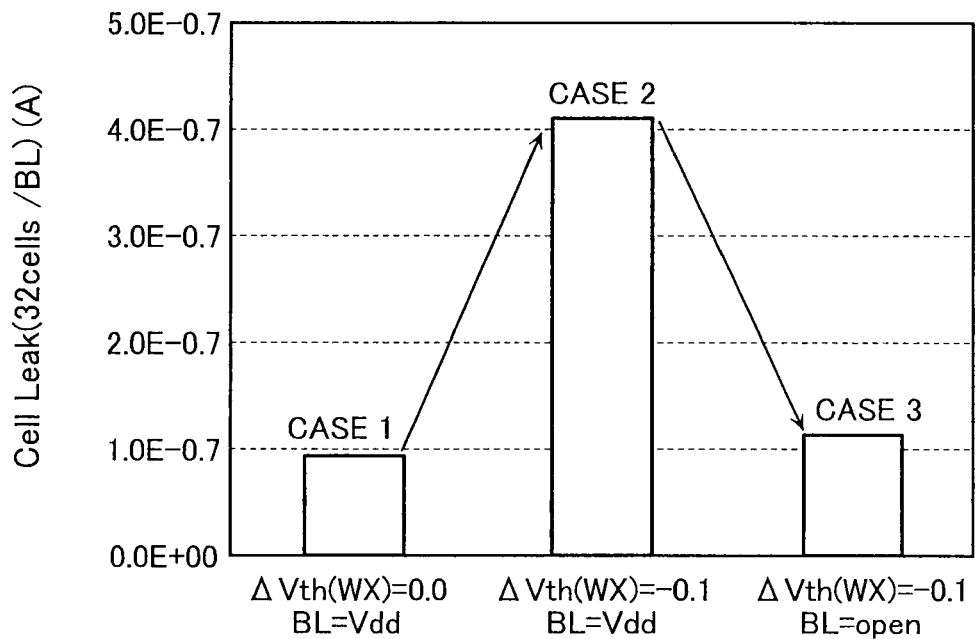
FIG. 6 is a graph illustrating a leak current of the memory cell in the first embodiment.

The threshold voltages Vth of the transfer transistors WX1 and WX2 are set lower, which allows the write failure rate to be reduced. At the same time, the leak current of the memory cell MC is increased. FIG. 6 illustrates the leak current of the memory cell MC. In the case 1 and case 2, the writing bit lines WBL and WBLB are precharged to the power supply voltage Vdd like the conventional technique. The leak current is about 100 nA in the case 1, whereas the leak current reaches about 400 nA of about four times in the case 2 in which the threshold voltages Vth of the transfer transistors WX1 and WX2 are lower than that of the case 1 by 0.1 V. On the other hand, in the case 3 in which the writing bit line BL is in the floating state, it is found that, because the leak currents of the transfer transistors WX1 and WX2 can be reduced smaller than those of the conventional technique by about one figure, the leak current is restrained to the same level as the case 1 although the threshold voltages Vth of the transfer transistors WX1 and WX2 are equal to those of the case 2. In other words, even in the same threshold voltages Vth of the transfer transistors WX1 and WX2, compared with the case 2 in which the writing bit line BL is precharged to "H", the leak current can be restrained to about a quarter in the case 3 in which the writing bit line BL is in the floating state. That is, the increase in leak current caused by lowering the threshold voltages Vth of the transfer transistors WX1 and WX2 can be compensated.

As described above, in the first embodiment, the write failure can be restrained by lowering the threshold voltages Vth of the writing transfer transistors WX1 and WX2. During the data write, the increase in leak current is prevented in the writing transfer transistors WX1 and WX2 by setting the writing bit lines WBL and WBLB except for the selected byte in the floating state, so that the low voltage can be achieved without increasing the leak current.

Second Embodiment

A reading transfer transistor RX and a driving transistor RD, in which threshold voltages Vth are lower than those of the SRAM of the first embodiment, are used in SRAM according to a second embodiment of the invention. Specifically, the threshold voltages Vth of the reading transfer transistor RX and driving transistor RD are substantially equal to the threshold voltages Vth of the writing transfer transistors WX1 and WX2, and are lower than the threshold voltages Vth of the driving transistors DV1 and DV2. The precharge is not performed to the reading bit line RBL during standby.

A current driving force is increased during the data read by lowering the threshold voltages Vth of the transfer transistor RX and driving transistor RD, so that a data read speed can be enhanced in SRAM.

Further, the precharge is not performed to the reading bit line RBL during standby, so that the leak current can be cut off.

In the second embodiment, not only is the effect similar to that of the first embodiment obtained, but also the current leakage can be restrained while the operation speed is enhanced during the data read.

Other Embodiment

Figure 7:
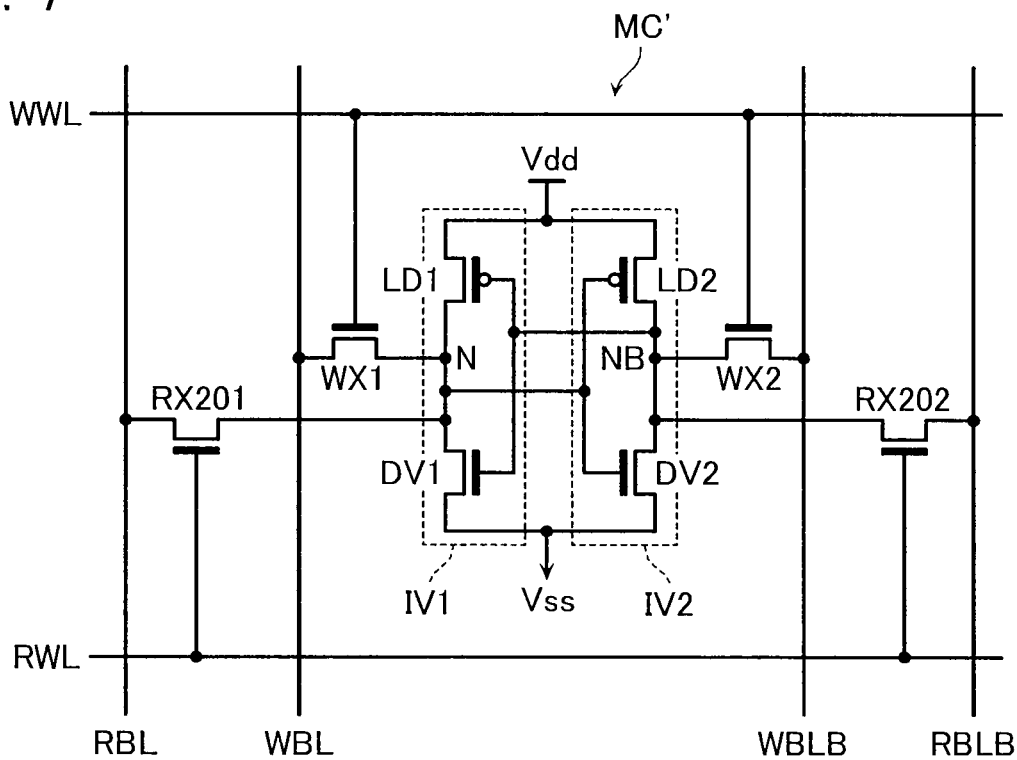
FIG. 7 is a circuit diagram illustrating a memory cell of SRAM according to a third embodiment of the invention.

Although the embodiments of the invention have been described above by way of example, the invention is not limited to the embodiments. Various changes and additions can be made without departing from the scope of the invention. For example, an eight-transistor memory cell MC' of FIG. 7 can be used as the memory cell.

In the eight-transistor memory cell MC', the data is read by reading bit lines of a complementary pair. Specifically, the eight-transistor memory cell MC' includes first and second reading bit lines RBL and RBLB of the complementary pair instead of the reading bit line RBL, transfer transistor RX, and driving transistor RD of the eight-transistor memory cell MC of FIG. 2. The reading bit lines RBL and RBLB and the cell nodes N and NB are connected through third and fourth transfer transistors RX201 and RX202 each of which is controlled by the reading word line WWL.

Even if the memory cell MC' is used, the effect similar to that of the memory cell MC can be obtained.

What is claimed is:

1. A semiconductor memory device comprising:
a plurality of word lines each of which includes a writing word line and a reading word line;
a plurality of bit lines each of which includes first and second writing bit lines and a reading bit line, the first and second writing bit lines and the reading bit line intersecting with the plurality of word lines;
a plurality of memory cells that are provided at portions in which the plurality of word lines and the plurality of bit lines intersect with each other,
wherein the memory cell includes:
a flip-flop circuit in which inputs and outputs of a first inverter and a second inverter are mutually connected, the first inverter including a first transistor of the first conduction type and a second transistor of the second conduction type, the first inverter being connected between a power supply line and a ground line, the second inverter including a third transistor of the first conduction type and a fourth transistor of the second conduction type, the second inverter being connected between the power supply line and the ground line;
a fifth transistor of the second conduction type that is connected between the output of the first inverter and the first writing bit line, a gate of the fifth transistor being connected to the writing word line;
a sixth transistor of the second conduction type that is connected between the output of the second inverter and the second writing bit line, a gate of the sixth transistor being connected to the writing word line;
a seventh transistor of the second conduction type, in which a drain is connected to the reading bit line and a gate is connected to the reading word line; and
an eighth transistor, in which a source is connected to the ground line, a drain is connected to the source of the seventh transistor, and a source is connected to the input of the first inverter and the output of the second inverter,
wherein the writing word line is divided into a plurality of unit writing word lines, and data is written in the predetermined memory cell connected to the selected unit writing word line during data write,
wherein thresholds of the seventh and eighth transistors are equal thresholds of the fifth and sixth transistors, and are lower than the thresholds of the second and forth transistors,
wherein the reading bit line is precharged to the power supply potential during a normal operation, and is not precharged to the power supply potential during standby, and
whenever data is not being written to the memory cell, the first and second writing bit lines are in a floating state and are not precharged to a predetermined potential.

2. The semiconductor memory device according to claim 1, wherein one of the first and second writing bit lines is a power supply potential and the other is a ground potential during data write.

* * * * *